United States Patent
Cushen et al.

(10) Patent No.: US 9,431,219 B1
(45) Date of Patent: Aug. 30, 2016

(54) METHOD FOR MAKING GUIDING LINES WITH OXIDIZED SIDEWALLS FOR USE IN DIRECTED SELF-ASSEMBLY (DSA) OF BLOCK COPOLYMERS

(71) Applicant: HGST Netherlands B.V., Amsterdam (NL)

(72) Inventors: Julia Cushen, Mountain View, CA (US); Ricardo Ruiz, Santa Clara, CA (US); Lei Wan, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/704,082

(22) Filed: May 5, 2015

(51) Int. Cl.
| | |
|---|---|
| *H01L 21/3065* | (2006.01) |
| *H01L 21/308* | (2006.01) |
| *C03C 15/00* | (2006.01) |
| *B82B 3/00* | (2006.01) |
| *B82Y 40/00* | (2011.01) |
| *H01J 37/32* | (2006.01) |
| *B05D 3/14* | (2006.01) |
| *H01L 21/027* | (2006.01) |
| *B81C 1/00* | (2006.01) |
| *G11B 5/855* | (2006.01) |
| *G11B 5/84* | (2006.01) |
| *H01L 21/311* | (2006.01) |

(52) U.S. Cl.
CPC ......... *H01J 37/32366* (2013.01); *B05D 3/145* (2013.01); *B82B 3/0014* (2013.01); *B82Y 40/00* (2013.01); *C03C 15/00* (2013.01); *H01L 21/3065* (2013.01); *H01L 21/3086* (2013.01); *B81C 1/00396* (2013.01); *G11B 5/8404* (2013.01); *G11B 5/855* (2013.01); *H01J 2237/3341* (2013.01); *H01L 21/0271* (2013.01); *H01L 21/0272* (2013.01); *H01L 21/31138* (2013.01)

(58) Field of Classification Search
None
See application file for complete search history.

(56) References Cited

U.S. PATENT DOCUMENTS

| | | | |
|---|---|---|---|
| 7,976,715 B2 | 7/2011 | Dobisz et al. | |
| 8,059,350 B2 | 11/2011 | Albrecht et al. | |
| 8,119,017 B2 | 2/2012 | Albrecht et al. | |
| 2013/0078576 A1* | 3/2013 | Wu ........................ | C08F 293/00 430/296 |

(Continued)

OTHER PUBLICATIONS

Cushen et al., "Ordering Poly(trimethylsilyl -block-D,L-lactide) Block Copolymers in Thin Films by Solvent Annealing Using a Mixture of Domain-Selective Solvents", Journal of Polymer Science, Part B: Polymer Physics 2014, 52, 36-45, published online Nov. 6, 2013.

*Primary Examiner* — Anita Alanko
(74) *Attorney, Agent, or Firm* — Thomas R. Berthold

(57) ABSTRACT

A method that uses both electron beam (e-beam) lithography and directed self-assembly (DSA) of block copolymers (BCPs) makes guiding lines with oxidized sidewalls for use in subsequent DSA of BCPs. A series of films is deposited on a substrate including a first cross-linked polymer mat layer, a layer of resist, an etch stop layer resistant to oxygen reactive-ion-etching, a second cross-linked polymer mat layer, and an e-beam resist. After patterning and etching the second mat layer, a BCP self-assembles onto the patterned second mat layer and one of the BCP components is removed. Then the second mat layer is etched, using the remaining BCP component as an etch mask. Additional etching steps then create guiding lines of the first mat layer with oxidized sidewalls. The resulting guiding lines have better quality and lower roughness than guiding lines made with just e-beam lithography.

20 Claims, 8 Drawing Sheets

(56) References Cited

U.S. PATENT DOCUMENTS

2014/0087016 A1    3/2014  Gao et al.
2015/0111387 A1*   4/2015  Somervell .................. G03F 7/42
                                                    438/703

\* cited by examiner

METHOD FOR MAKING GUIDING LINES WITH OXIDIZED SIDEWALLS FOR USE IN DIRECTED SELF-ASSEMBLY (DSA) OF BLOCK COPOLYMERS

BACKGROUND OF THE INVENTION

1. Field of the Invention

This invention relates generally to the directed self-assembly (DSA) of block copolymers (BCPs) using guiding lines to make an etch mask for pattern transfer into a substrate, and more particularly to a method for making the guiding lines.

2. Description of the Related Art

Directed self-assembly (DSA) of block copolymers (BCPs) has been proposed for making imprint templates for patterned media (also called bit-patterned media) magnetic recording disks and for patterning semiconductor devices, for example, for patterning parallel generally straight lines in MPU, DRAM and NAND flash devices. DSA of BCPs by use of a patterned sublayer that provides a chemical contrast pattern for the BCP film is well-known. After the BCP components self-assemble on the patterned sublayer, one of the components is selectively removed, leaving the other component with the desired pattern, which can then be used as an etch mask to transfer the pattern into an underlying substrate. The etched substrate can be used as an imprint template.

In conventional DSA by use of a chemical contrast pattern, an array of sparse guiding lines, usually made of a cross-linkable polymer mat, is lithographically patterned on the substrate. The pitch of these guiding lines (Ls) needs to be an integer multiple of the natural pitch ($L_0$) formed by the block copolymer to be directed, i.e., Ls=$nL_0$, where n is an integer equal to or greater than 1. However, the width of the guiding lines generally needs to be about 0.5 $L_0$, or nearly equal to the width of one of the block copolymer components. While lithographic applications benefit from the fact that the guiding lines can be sparse (at a pitch of $nL_0$) and that the high density comes from the density multiplication afforded by the block copolymers, the resolution requirement to pattern the width of the guiding lines keeps scaling with the final block copolymer dimensions. As lithographic applications advance to smaller dimensions, especially below 20 nm full pitch, the fabrication of guiding lines with a width below 10 nm while maintaining adequate roughness and width uniformity becomes ever more difficult and beyond what is possible with current resist materials for electron-beam (e-beam) or optical lithography.

Pending application Ser. No. 14/532,240 filed Nov. 4, 2014 and assigned to the same assignee as this application describes a pattern of guiding lines for DSA of a BCP that is an array of spaced guiding lines with oxidized sidewalls. A silicon-containing BCP self-assembles with the silicon-free BCP component wetting the oxidized sidewalls. The silicon-free BCP component is removed. The other BCP component then has a line density double that of the original spaced guiding lines and can be used as an etch mask to etch the underlying substrate. In the '240 application the spaced guiding lines are formed by electron-beam lithography. However, for small-pitch BCPs, it can be difficult to pattern guiding lines by e-beam lithography since it requires operating at the resolution limit of current e-beam resists. At the resolution limit of the e-beam resist, guiding lines are typically rough, broken, and/or wavy and cause defects in the BCP pattern that they guide. This effect is particularly severe for radial lines, which are required for making patterned media magnetic recording disks. Radial lines are more difficult to create by the e-beam tool due to the circumferential path of the beam, which results in an increased width roughness of the exposed lines. Also, radial lines require a smaller pitch than circumferential lines and thus a greater guiding line resolution to make patterned media bit structures with a high bit aspect ratio.

What is needed is an improved method for making guiding lines that results in a BCP pattern after DSA with better quality and lower roughness.

SUMMARY OF THE INVENTION

Embodiments of this invention relate to a method that uses both e-beam lithography and DSA of BCPs to make guiding lines with oxidized sidewalls for use in subsequent DSA of BCPs. A series of films is deposited on a substrate including a first cross-linked polymer mat layer, a layer of resist, an etch stop layer resistant to oxygen reactive-ion-etching, a second cross-linked polymer mat layer, and a second resist, preferably an e-beam resist. The e-beam resist on the second mat layer is patterned into a plurality of spaced e-beam resist stripes having a width substantially equal to $nL_0$ and a pitch substantially equal to $(n+k)L_0$, where n and k are integers equal to or greater than 1. Then the exposed second mat layer is reactive-ion-etched in an oxygen gas to remove the e-beam resist and oxidize the exposed second mat layer, leaving a plurality of alternating second mat stripes and oxidized second mat stripes. A BCP is deposited on the second mat stripes and oxidized second mat stripes and self-assembles into said first and second components on the second mat stripes and oxidized second mat stripes. After the BCP has self-assembled, the BCP component on the second mat stripes is removed. Then the second mat layer is etched, using the BCP component on the oxidized second mat stripes as an etch mask. This exposes the underlying etch stop layer. The exposed etch stop layer is then etched, leaving stripes of etch stop layer on the resist layer. The exposed resist layer and underlying first mat layer is then reactive-ion-etched in an oxygen gas, using the stripes of etch stop layer as an etch mask, leaving stripes of the first mat layer as guiding stripes with oxidized sidewalls. The remaining resist layer and etch stop layer material is removed. The guiding stripes have a width substantially equal to $nL_0$ and a pitch substantially equal to $(n+k)L_0$, where n and k are integers equal to or greater than 1. Because a BCP is used to define the guiding lines instead of using the e-beam resist lines directly, the resulting guiding lines have better quality and lower roughness than guiding lines made with just e-beam lithography.

For a fuller understanding of the nature and advantages of the present invention, reference should be made to the following detailed description taken together with the accompanying figures.

DETAILED DESCRIPTION OF THE INVENTION

Figure 1A:
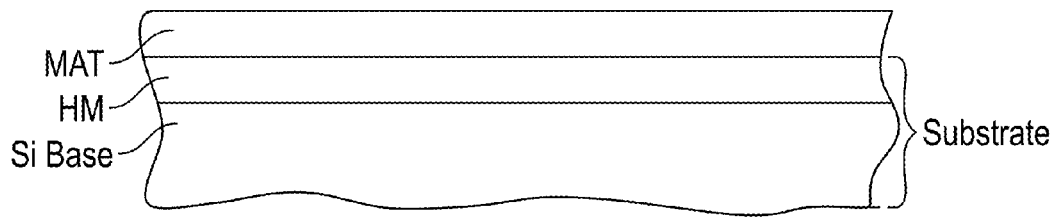
FIGS. 1A-1G are schematic sectional views illustrating steps for making an etched substrate using the directed self-assembly (DSA) method of block copolymers (BCPs) according to applicants' pending application Ser. No. 14/532,240.

Self-assembling block copolymers (BCPs) have been proposed for creating periodic nanometer (nm) scale features. Self-assembling BCPs typically contain two or more different polymeric block components, for example components A and B, that are immiscible with one another. Under suitable conditions, the two or more immiscible polymeric block components separate into two or more different phases or microdomains on a nanometer scale and thereby form ordered patterns of isolated nano-sized structural units. There are many types of BCPs that can be used for forming the self-assembled periodic patterns. If one of the components A or B is selectively removable without having to remove the other, then orderly arranged structural units of the un-removed component can be formed.

Specific examples of suitable BCPs that can be used for forming the self-assembled periodic patterns include, but are not limited to: poly(styrene-block-methyl methacrylate) (PS-b-PMMA), poly(ethylene oxide-block-isoprene) (PEO-b-PI), poly(ethylene oxide-block-butadiene) (PEO-b-PBD), poly(ethylene oxide-block-styrene) (PEO-b-PS), poly(ethylene oxide-block-methylmethacrylate) (PEO-b-PMMA), poly(ethyleneoxide-block-ethylethylene) (PEO-b-PEE), poly(styrene-block-vinylpyridine) (PS-b-PVP), poly(styrene-block-isoprene) (PS-b-PI), poly(styrene-block-butadiene) (PS-b-PBD), poly(styrene-block-ferrocenyldimethylsilane) (PS-b-PFS), poly(butadiene-block-vinylpyridine) (PBD-b-PVP), poly(isoprene-block-methyl methacrylate) (PI-b-PMMA), poly(styrene-block-lactic acid) (PS-b-PLA) and poly(styrene-block-dymethylsiloxane) (PS-b-PDMS).

The specific self-assembled periodic patterns formed by the BCP are determined by the molecular volume ratio between the first and second polymeric block components A and B. When the ratio of the molecular volume of the second polymeric block component B over the molecular volume of the first polymeric block component A is less than about 80:20 but greater than about 60:40, the BCP will form an ordered array of cylinders composed of the first polymeric block component A in a matrix composed of the second polymeric block component B. When the ratio of the molecular volume of the first polymeric block component A over the molecular volume of the second polymeric block component B is less than about 60:40 but is greater than about 40:60, the BCP will form alternating lamellae composed of the first and second polymeric block components A and B. When the ratio of B over A is greater than about 80:20 the BCP will form an ordered array of spheres in a matrix of the second component. For lamellar or cylinder forming BCPs, the orientation of the lamellae or the cylinders with respect to the substrate depends on the interfacial energies (wetting properties) of the block copolymer components at both the substrate interface and at the top interface. When one of the block components preferentially wets the substrate (or the top free interface) the block copolymers form layers parallel to the substrate. When the wetting properties at the interface are neutral to either block, then both block components can be in contact with the interface, facilitating the formation of block copolymer domains with perpendicular orientation. In practice, the wetting properties of the substrate are engineered by coating the substrate with "surface modification layers" that tune the wetting properties at the interface. Surface modification layers are usually made of polymer brushes or mats typically (but not necessarily) composed of a mixture of the constituent block materials of the BCP to be used.

The periodicity or natural pitch ($L_0$) of the repeating structural units in the periodic pattern BCP components is determined by intrinsic polymeric properties such as the degree of polymerization N and the Flory-Huggins interaction parameter $\chi$. $L_0$ scales with the degree of polymerization N, which in turn correlates with the molecular weight M. Therefore, by adjusting the total molecular weight of the BCP, the natural pitch ($L_0$) of the repeating structural units can be selected.

To form the self-assembled periodic patterns, the BCP is first dissolved in a suitable solvent system to form a BCP solution, which is then applied onto a surface to form a thin BCP layer, followed by annealing of the thin BCP layer, which causes phase separation between the different polymeric block components contained in the BCP. The solvent system used for dissolving the BCP and forming the BCP solution may comprise any suitable non-polar solvent, including, but not limited to: toluene, methylisobutylketone (MIBK), propylene glycol monomethyl ether acetate (PGMEA), propylene glycol monomethyl ether (PGME), and acetone. The BCP solution can be applied to the substrate surface by any suitable techniques, including, but not limited to: spin casting, coating, spraying, ink coating, dip coating, etc. Preferably, the BCP solution is spin cast onto the substrate surface to form a thin BCP layer. After application of the thin BCP layer onto the substrate surface, the entire substrate is annealed to effectuate microphase segregation of the different block components contained by the BCP, thereby forming the periodic patterns with repeating structural units.

The BCP films in the above-described techniques self-assemble without any direction or guidance. This undirected self-assembly results in patterns with defects so it is not practical for applications that require long-range ordering, such as imprint templates for bit-patterned media or integrated circuits. However, directed self-assembly (DSA) of block copolymers (BCPs) has been proposed for making imprint templates for making bit-patterned media and integrated circuits, and for patterning layers formed on semiconductor wafers, for example for patterning parallel generally straight lines in MPU, DRAM and NAND flash devices. DSA of BCPs by use of a patterned sublayer as a chemical contrast pattern that acts as guiding lines for the BCP film is well-known, as described for example in U.S. Pat. No. 7,976,715; U.S. Pat. No. 8,059,350; and U.S. Pat. No. 8,119,017.

A method for making guiding lines with oxidized sidewalls for use in DSA of BCPs is described in pending application Ser. No. 14/532,240 filed Nov. 4, 2014 and assigned to the same assignee as this application. The guiding pattern for DSA is an array of generally equally spaced guiding lines with a width equal to $nL_0$ and a pitch equal to $(n+k)L_0$, where n and k are integers equal to or greater than 1. Because the guiding lines do not have to have a width of $0.5L_0$, this makes it easier to fabricate a high quality chemical contrast guiding line pattern. Unlike the prior art, the chemical contrast is generated by the chemistry on the sidewalls of the guiding stripes. A silicon-containing BCP self-assembles with the silicon-free BCP component wetting the oxidized sidewalls. The silicon-free BCP component is removed. The other BCP component then has a line density double that of the original spaced guiding lines and can be used as an etch mask to etch the underlying substrate.

FIGS. 1A-1G are schematic sectional views illustrating steps in the DSA method according to the '240 application. In FIG. 1A, the substrate is a single-crystal silicon (Si) base with a hard mask (HM) layer, for example a diamond-like carbon (DLC) layer. A cross-linked polymer mat layer (MAT), for example a cross-linked polystyrene (XPS) mat layer, is formed on the HM layer.

Figure 1B:
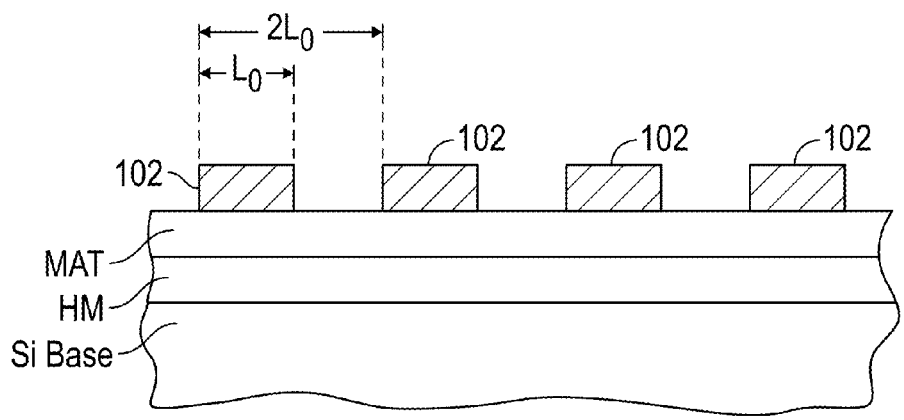

In FIG. 1B, an e-beam resist layer has been deposited on the MAT and lithographically patterned by e-beam to form resist stripes 102 with a width substantially equal to $nL_0$, where n is an integer equal to or greater than 1 and $L_0$ is the natural pitch of the BCP to be subsequently deposited. In this example n=1.

Figure 1C:
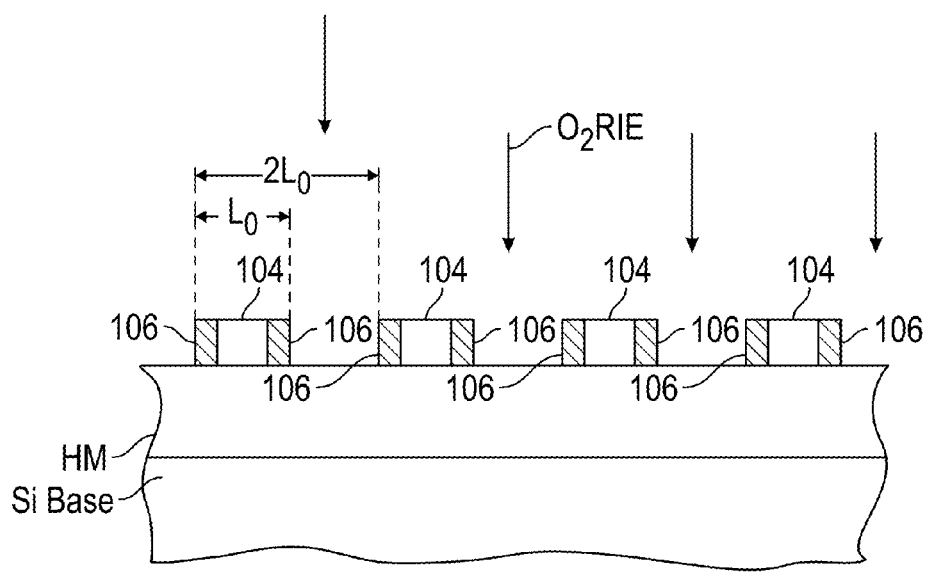

In FIG. 1C, the MAT has been etched by reactive ion etching (RIE) in an oxygen gas, using the resist stripes 102 as an etch mask, after which the resist has been removed. This leaves guiding lines or stripes 104 of mat material. However, the RIE oxygen process has also oxidized the polystyrene to form oxidized sidewalls 106 on the mat guiding stripes 104.

Figure 1D:
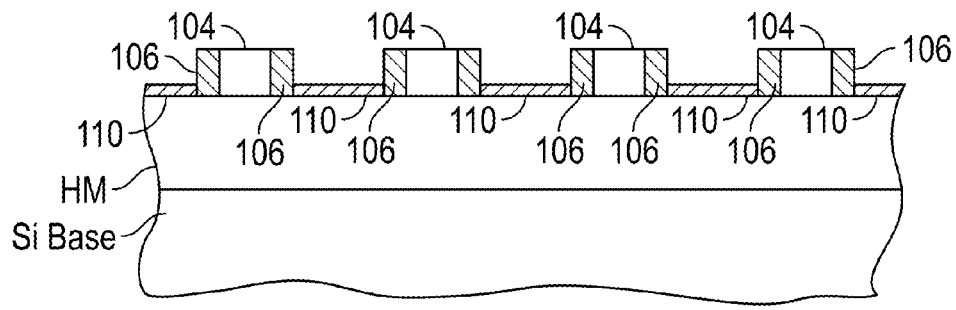

In FIG. 1D, a polymer brush material 110 has been grafted onto the HM between the guiding stripes 104 and then the ungrafted polymer brush material has been rinsed away. The brush material 110 has a thickness substantially less than the thickness of the mat guiding stripes 104 so that the oxidized sidewalls 106 are exposed and not covered with brush material.

Figure 1E:
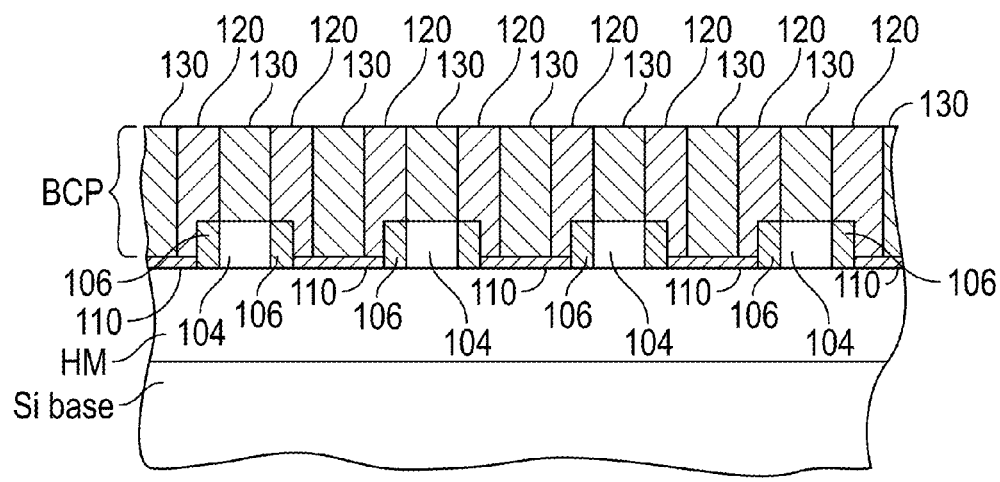

In FIG. 1E a BCP has been deposited over the mat guiding stripes 104 and brush material 110 and annealed. This results in self-assembly of the two BCP components 120, 130 as lamellae perpendicular to the substrate. The self-assembly is guided by the oxidized sidewalls 106 of the mat guiding stripes 104. The more polar BCP component 120 wets the polar oxide, while the other BCP component 130 has no strong preference to wet either the polar oxide or the brush material and is forced to self-assemble between the components 120. In the preferred embodiment the BCP is a silicon-containing BCP, such as, but not limited to, poly (styrene-block-dimethylsiloxane) (PS-b-PDMS), poly(trim-ethylsilylstyrene-block-D,L lactide) (PTMSS-b-PLA), poly (styrene-block-trimethylsilylstyrene-block-styrene) (PS-b-PTMSS-b-PS) or poly(trimethylsilyl styrene)-block-poly (methoxystyrene) (PTMSS-b-PMOST). In this example the BCP is (PTMSS-b-PMOST). PTMSS-b-PMOST, as well as (PS-b-PDMS), (PTMSS-b-PLA) and (PS-b-PTMSS-b-PS), are desirable because they have a natural pitch $L_0$ less than 20 nm. The PMOST, shown as BCP component 120 in FIG. 1E, wets the oxidized sidewalls 106. This results in self-assembly of the PTMSS, shown as BCP component 130 in FIG. 1E, on tops of the mat guiding stripes 104 and in the centers of the brush material 110 between the mat guiding stripes 104.

Figure 1F:
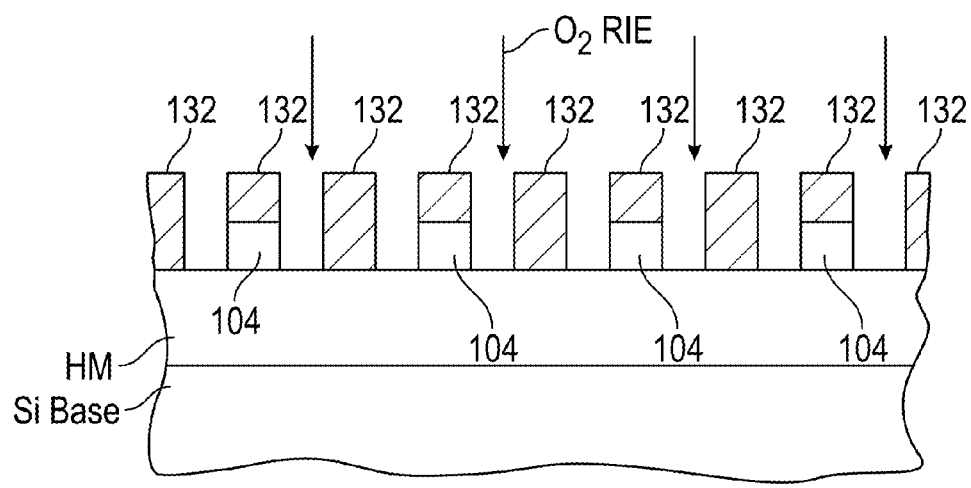

In FIG. 1F an oxygen RIE process has removed the PMOST component and the brush material, as well as the oxidized sidewalls on the mat guiding stripes 104. The oxygen RIE process has also oxidized the Si in the PTMSS, creating $SiO_2$ in the PTMSS component, leaving pillars 132 of PTMSS with $SiO_2$, which now have a substantially reduced thickness from the PTMSS component 130 in FIG. 1E. The pillars 132 of oxidized PTMSS will serve as an etch mask to etch the underlying HM layer.

Figure 1G:
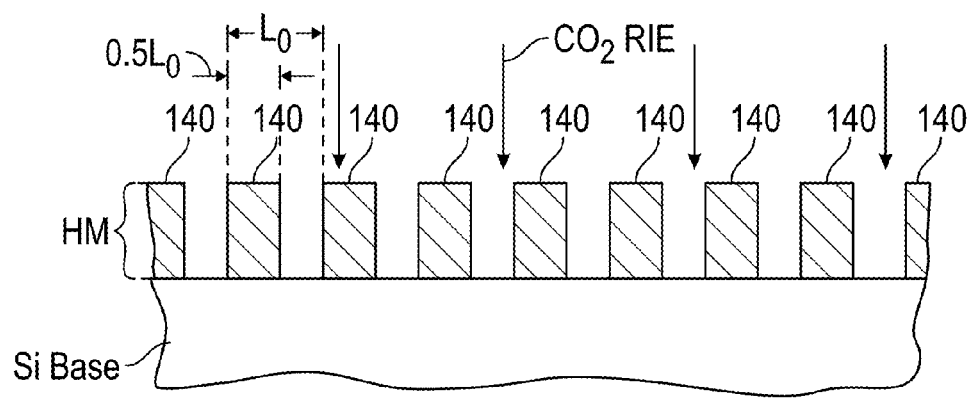

In FIG. 1G, the HM has been etched in a $CO_2$ RIE process using the $SiO_2$ containing PTMSS pillars 132 (FIG. 1F) as an etch mask. Since the silicon in the PTMSS oxidizes during the first oxygen RIE step and $SiO_2$ is not a good etch mask for pattern transfer into a silicon substrate, the DLC HM layer is used as a transfer layer between the oxidized PTMSS and the silicon base. The etching leaves pillars 140 of HM material with a width substantially equal to 0.54 (one-half the width of the mat guiding stripes 104 in FIG. 1B) and with a pitch $L_0$ (one half the pitch of the mat guiding stripes 104 in FIG. 1B). The HM pillars 140 can be used as an etch mask in a $CHF_3/CF_4$ RIE step to etch the substrate base, which would result in an etched substrate with spaced bars and recesses.

In the '240 application the spaced guiding lines 102 in FIG. 1B are formed by electron-beam (e-beam) lithography. However, for small-pitch BCPs, it can be difficult to pattern guiding lines by e-beam lithography since it requires operating at the resolution limit of current e-beam resists. At the resolution limit of the e-beam resist, guiding lines are typically rough, broken, and/or wavy and cause defects in the BCP pattern that they guide. This effect is particularly severe for radial lines, which are required for making patterned media magnetic recording disks. Radial lines are more difficult to create by the e-beam tool due to the circumferential path of the beam, which results in an increased width roughness of the exposed lines. Also, radial lines require a smaller pitch than circumferential lines and thus a greater guiding line resolution to make patterned media bit structures with a high bit aspect ratio.

Embodiments of this invention relate to an improved method that uses both e-beam lithography and DSA of BCPs to make guiding lines with oxidized sidewalls, like guiding stripes 104 with oxidized sidewalls 106 in FIG. 1C. Because a BCP is used to define the guiding lines instead of using the e-beam resist lines directly, the resulting guiding lines have better quality and lower roughness than those in the '240 application.

Figure 2A:
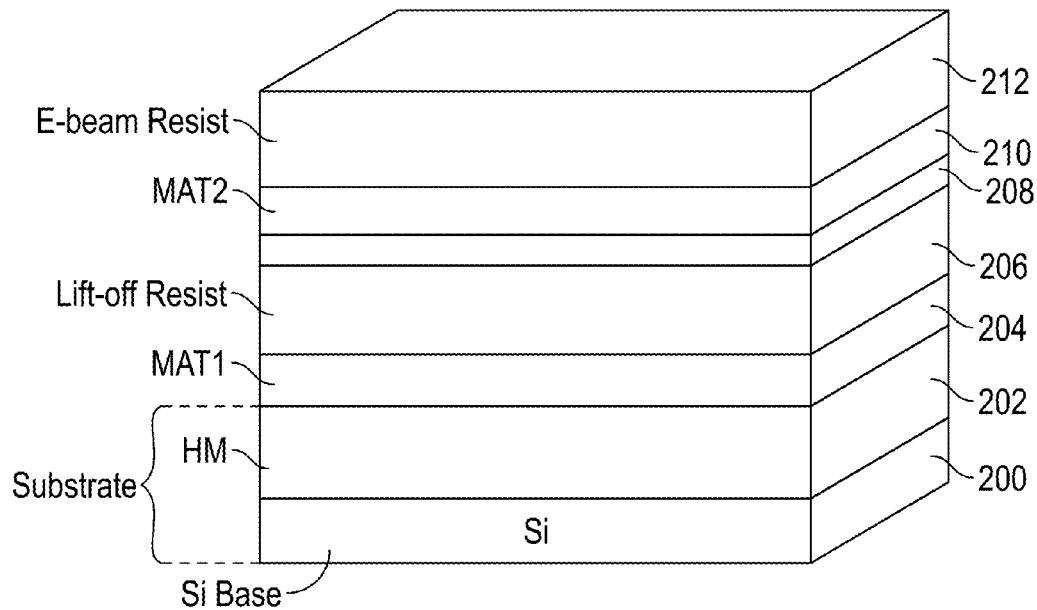
FIGS. 2A-2I are perspective views illustrating steps in the method for making guiding lines with oxidized sidewalls for use in DSA of a BCP according to embodiments of this invention.

FIGS. 2A-2I are perspective views illustrating steps in the method according to embodiments of the invention. In FIG. 2A, the substrate in this example is a single-crystal silicon (Si) base 200 with a hard mask (HM) layer 202, for example a diamond-like carbon (DLC) layer with a thickness of about 17 nm. The substrate base 200 may be formed of any suitable material, such as but not limited to, single-crystal Si, amorphous Si, silica, fused quartz, silicon nitride, carbon, tantalum, molybdenum, chromium, alumina or sapphire, with or without a HM layer. The base 200 may also be a layer formed on a semiconductor wafer if the layer is to be patterned using DSA of BCPs. A first cross-linked polymer mat layer 204 (MAT1), in this example a cross-linked polystyrene (XPS) mat layer, is formed to a thickness of about 8 nm on the HM layer 202. The cross-linkable polymer may be spin-coated to a thickness of 4-15 nm. The as-spun film is then annealed or treated by UV light for the cross-linking units to carry out the cross-linking After cross-linking, the cross-linked polymer layer is typically referred to as a mat layer. A 20 nm layer of lift-off resist 206, like PMGI based on polydimethylglutarimide, is formed as a first resist layer on MAT1, and a 5 nm etch stop layer 208 that is resistant to oxygen reactive-ion-etching (RIE) (e.g., a silicon-containing material like silicon-containing poly(trim-ethylsilylstyrene)) is formed on lift-off resist layer 206. A second 8 nm cross-linked polystyrene mat layer 210 (MAT2) is formed on etch stop layer 208, and a second resist layer, like a 50 nm e-beam resist layer 212 is formed on MAT2. The e-beam resist may be any commercial e-beam resist like PMMA, ZEP 520 from Zeon Corporation, or hydrogen silsesquioxane (HSQ). While an e-beam resist and subsequent patterning by e-beam is preferred, the method according to embodiments of this invention may also use a conventional resist and optical lithography.

Figure 2B:
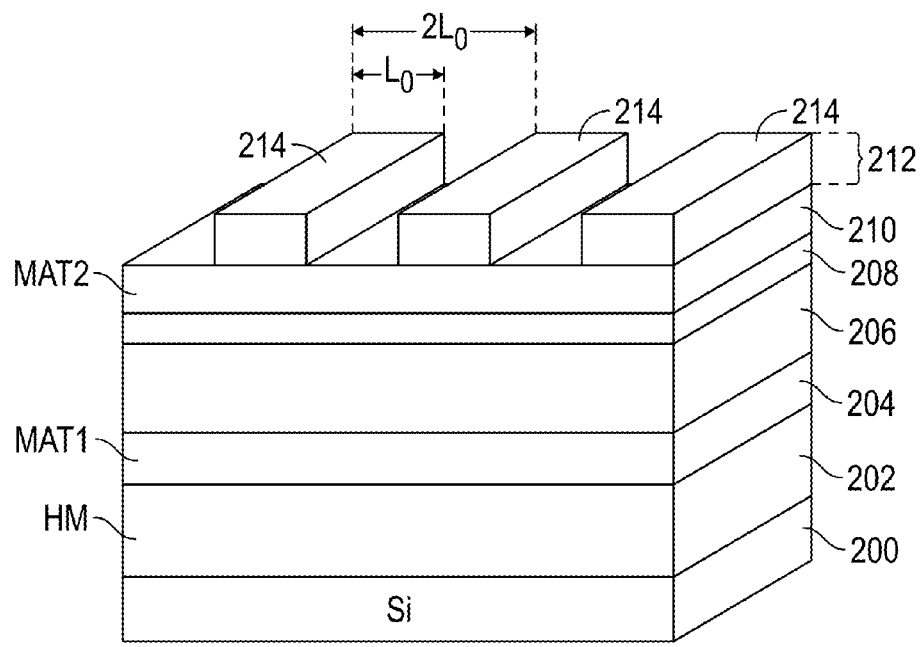

In FIG. 2B, the e-beam resist layer 212 has been lithographically patterned by e-beam to form generally equally spaced resist stripes 214 with a width substantially equal to $nL_0$, where n is an integer equal to or greater than 1 and $L_0$ is the natural pitch of the BCP to be subsequently deposited. The resist stripes 214 may have a pitch substantially equal to $(n+k)L_0$, where k is also equal to or greater than 1. In this example, n=1 and k=1, so the pitch is $2L_0$. For example, the stripe width can be about 20 nm and the stripe pitch about 40 nm. Because it may not be possible to precisely match the width and spacing of the resist stripes to $L_0$ during the e-beam lithographic process, the phrase "substantially equal" as used herein shall mean the referenced term plus or minus 10%. The e-beam writing of the resist can create spaced stripes 214 that are substantially parallel, that are concentric rings or that are generally radial lines. If the stripes are radial lines they may have spacing as small as $0.9L_0$ at the radially inner point and as large as $1.1L_0$ at the radially outer point. In this example the generally equally spaced resist stripes 214 are represented as parallel stripes.

Figure 2C:
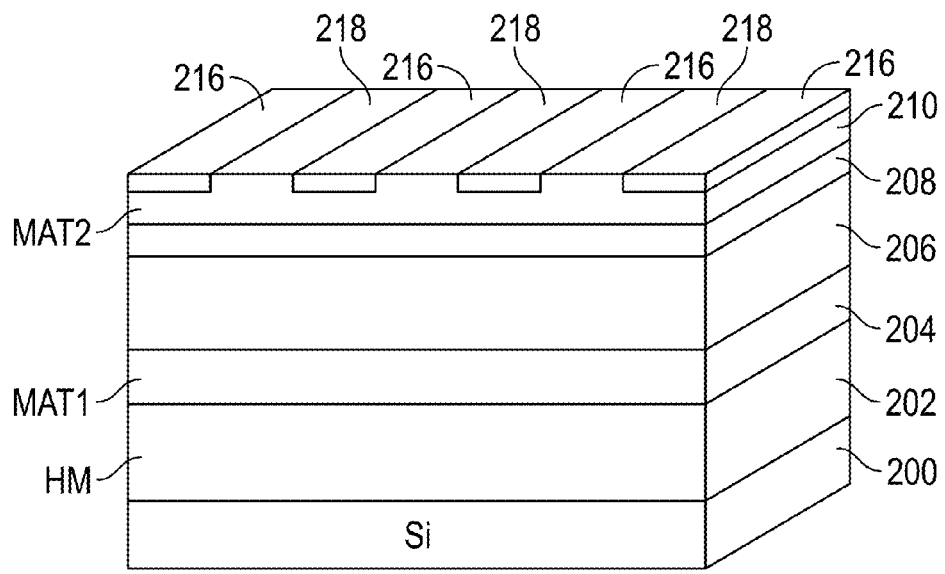

In FIG. 2C a short oxygen etch oxidizes 20 nm wide stripes 216 of exposed MAT2. This results in a chemical contrast pattern of oxidized MAT2 stripes 216 and non-oxidized MAT2 stripes 218 that were protected by the e-beam resist for subsequent conventional DSA of the BCP.

Figure 2D:
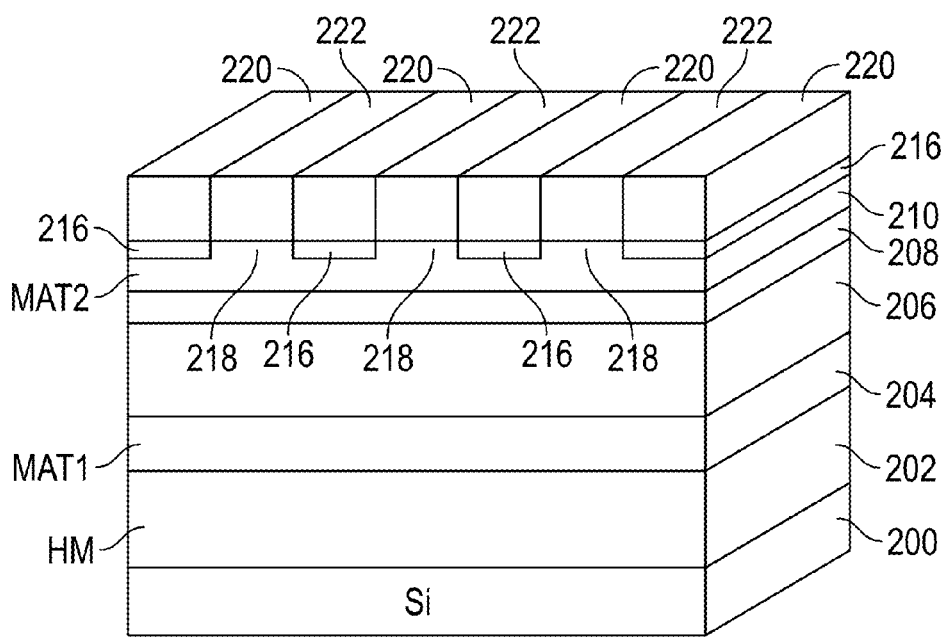

In FIG. 2D a BCP has been deposited over the chemical contrast pattern of oxidized MAT2 stripes 216 and MAT2 stripes 218 and then annealed, typically by thermal annealing or solvent annealing. The BCP may be PS-b-PMMA. This results in self-assembly of the two BCP components (PS 220 and PMMA 222) as lamellae perpendicular to the substrate. The self-assembly is guided by the MAT2 stripes 216 and MAT2 stripes 218 with the PS forming on stripes 216 and the PMMA forming on the stripes 218.

Figure 2E:
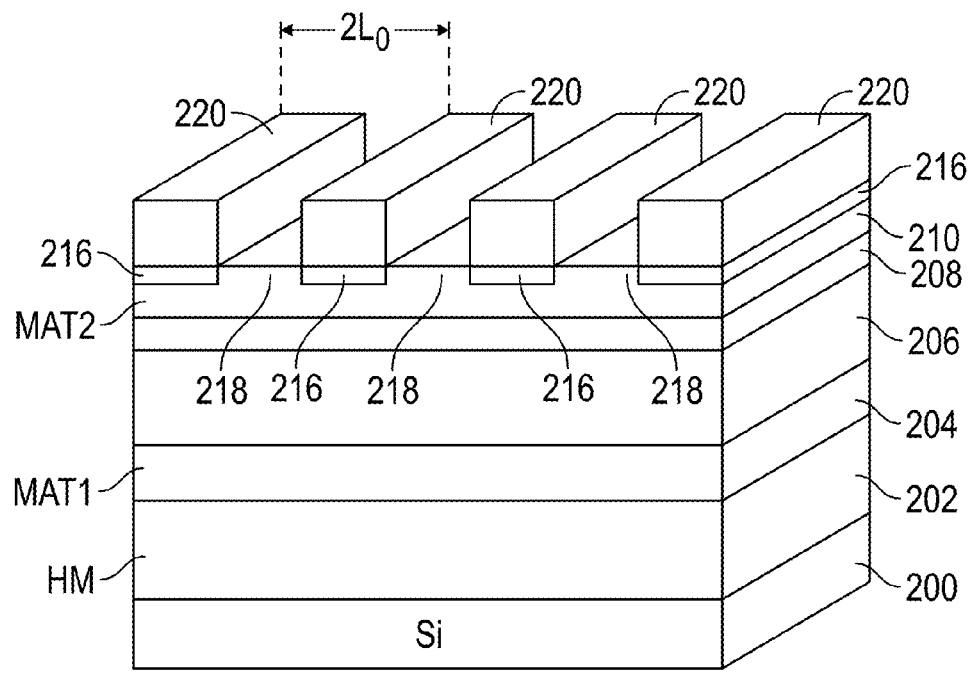

In FIG. 2E the PMMA has been removed by wet development in acetic acid for 2 minutes after exposure to 5 min of UV light. This leaves PS stripes 220 on the oxidized MAT2 stripes 216 separated by MAT2 stripes 218. The PS stripes 220 have a pitch of $2L_0$ (40 nm in this example).

Figure 2F:
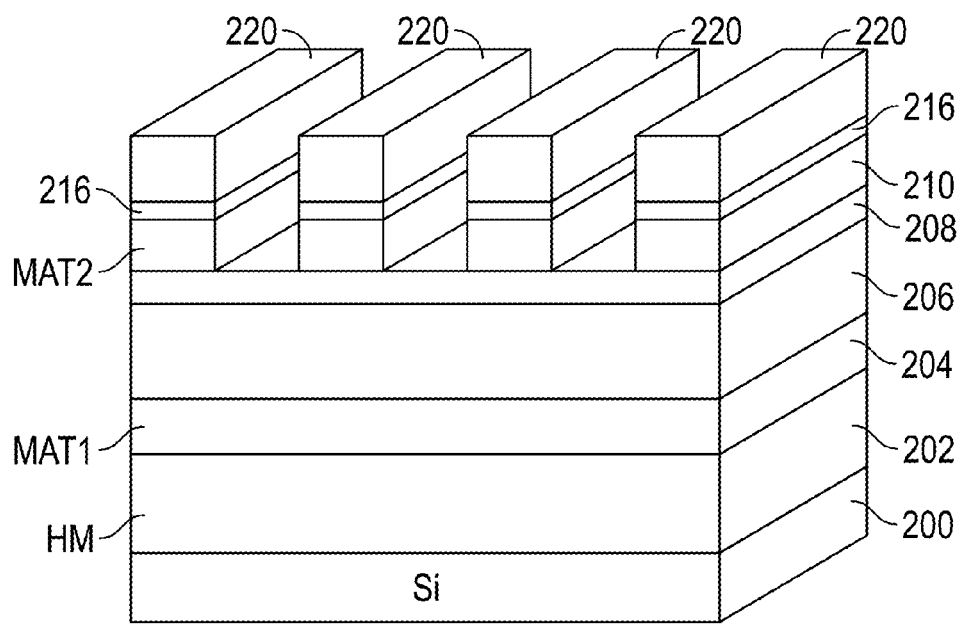

In FIG. 2F the pattern of PS stripes 220 is transferred into the etch stop layer 208 by oxygen RIE.

Figure 2G:
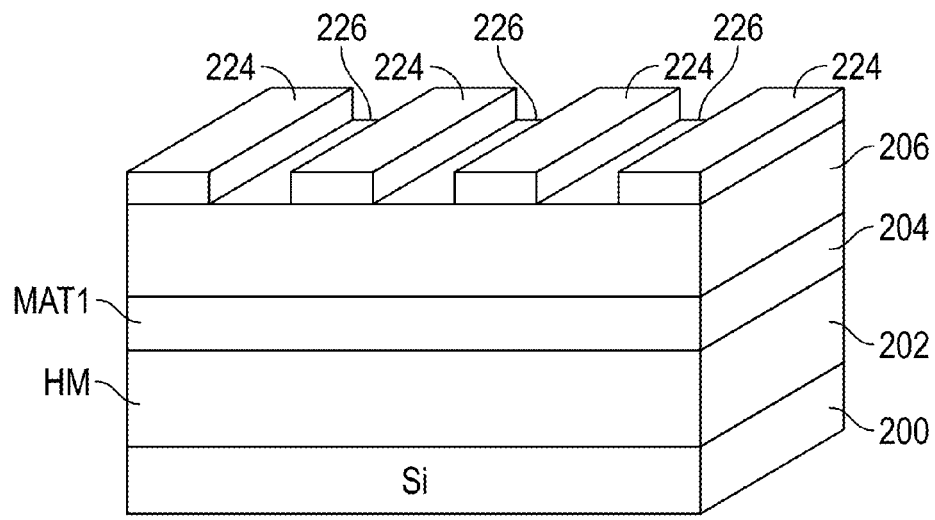

In FIG. 2G the etch stop layer is etched in the exposed regions using a fluorine gas RIE, like $CHF_3/CF_4$, to create an etch mask of etch stop stripes 224 separated by exposed stripes 226 of lift-off resist 206. This also removes the remaining MAT2 material and PS stripes 220.

Figure 2H:
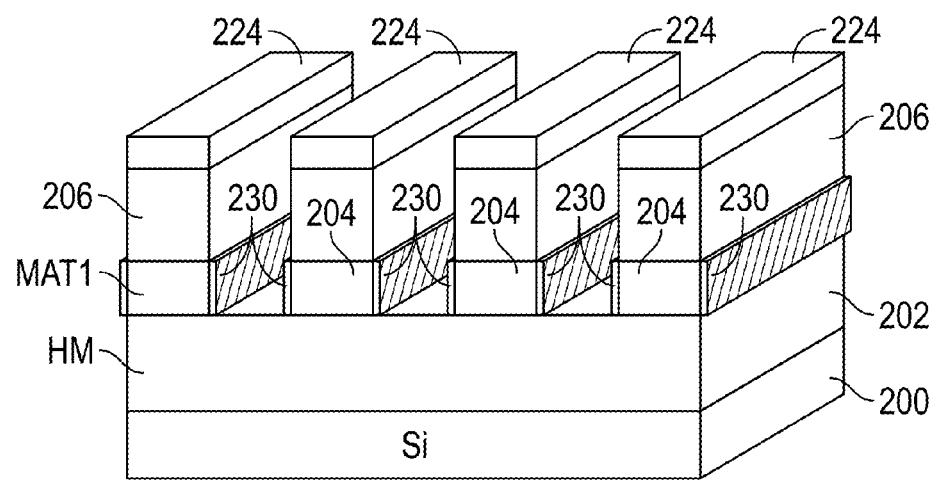

In FIG. 2H an oxygen RIE transfers the pattern through the lift-off resist layer 206 and bottom polystyrene MAT1 204. This forms MAT1 stripes 204 on the HM layer 202. The oxygen RIE process has also oxidized the exposed sidewalls of polystyrene MAT1 to form oxidized sidewalls 230 on the MAT1 stripes 204.

Figure 2I:
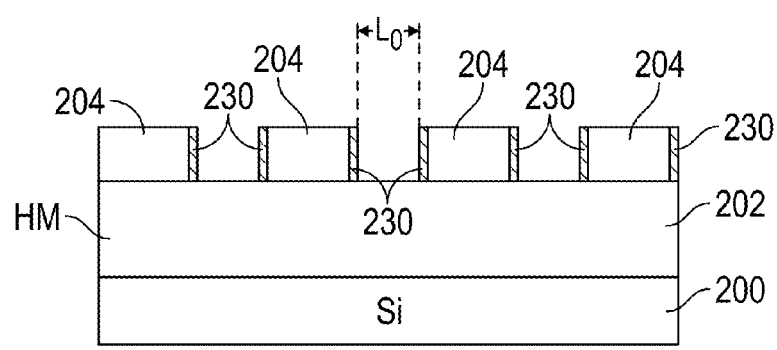

In FIG. 2I the remaining liftoff resist of layer 206 and any remaining etch stop stripes 224 have been removed by sonicating/rinsing with N-Methyl-2-pyrrolidone (NMP). The structure is soaked in hot NMP at 90° C. for 1 hour and then sonicated for 9 minutes in NMP. The result is a chemical contrast pattern of guiding stripes 204 with oxidized sidewalls 230 with $L_0$ pitch (half the pitch of the PS stripes 220 in FIG. 2E, or 20 nm in this example) for guiding the DSA of a BCP. FIG. 2I now shows the structure at the identical step in the process shown in FIG. 1C. At this point, the remaining steps in the process of the '240 application, as shown in FIGS. 1D-1G, can be performed.

The quality of the guiding stripes 204 with oxidized sidewalls 230 made according to embodiments of this invention is better than direct e-beam writing like that shown in FIGS. 1A-1C. The $2L_0$ pitch (40 nm in this example) of the PS-b-PMMA BCP heals the defects in the pattern from the e-beam writing step and results in improved line width roughness that stems from the more uniform BCP lines and not from the width of the e-beam resist. This is especially important when the guiding stripes are radial stripes, which are required for making imprint templates for patterned-media magnetic recording disks.

Figure 3A:
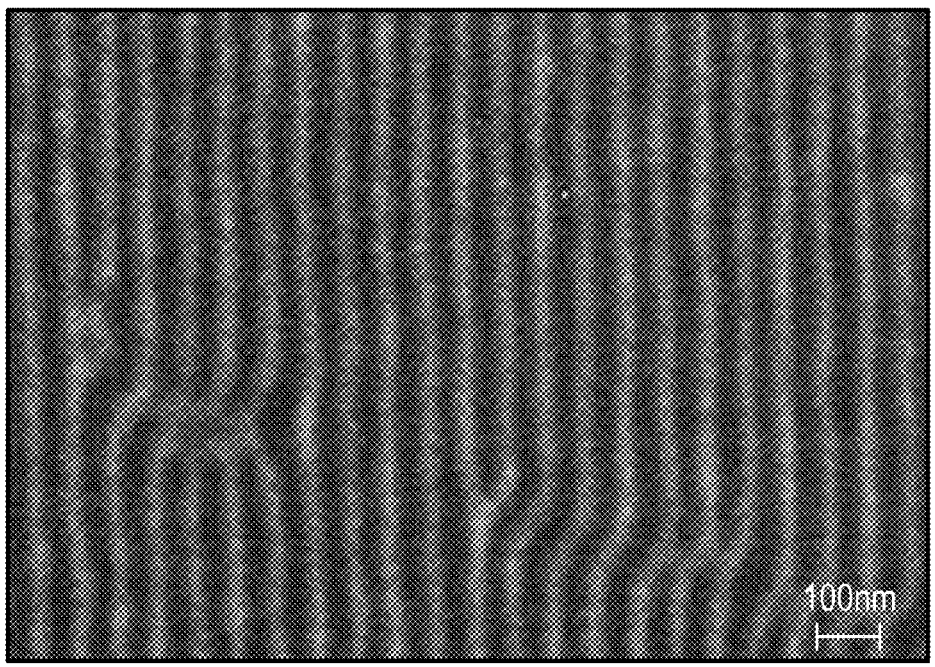
FIG. 3A is a scanning electron microscopy (SEM) image of guiding lines with oxidized sidewalls made with direct e-beam lithography, as described in applicants' pending '240 application.
Figure 3B:
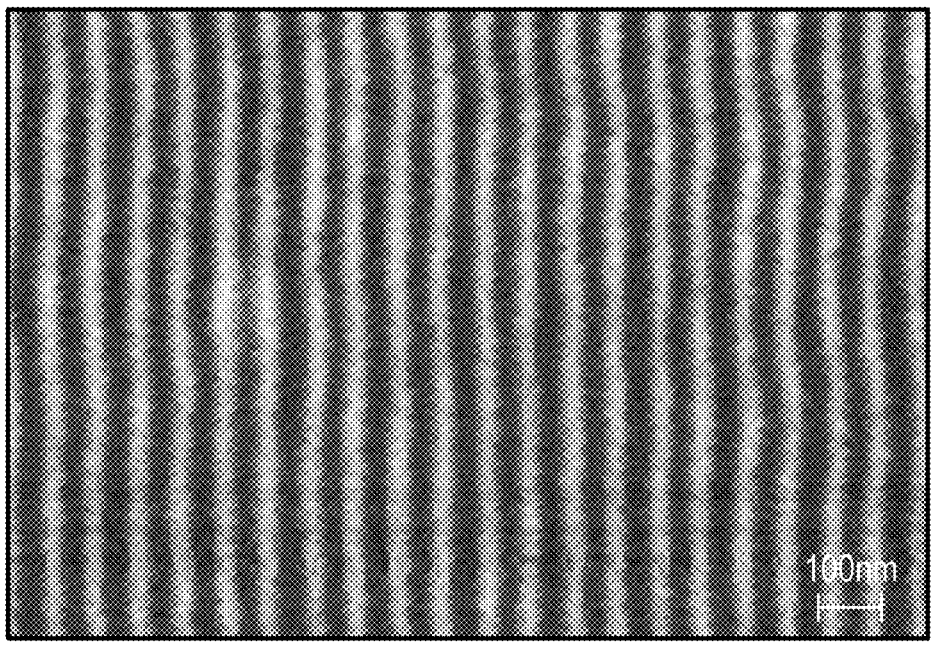
FIG. 3B is a SEM image of guiding lines with oxidized sidewalls made with e-beam lithography followed by DSA of a BCP according to embodiments of this invention.

FIG. 3A is a scanning electron microscopy (SEM) image of guiding lines with oxidized sidewalls made with direct e-beam lithography, as described in the '240 application. This image shows several defects, particularly bridging across adjacent guiding lines. FIG. 3B is a SEM image of guiding lines with oxidized sidewalls made with e-beam lithography followed by DSA of a BCP according to embodiments of this invention. This image shows no bridging.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method for making guiding lines on a substrate for directed self-assembly (DSA) of a block copolymer (BCP) having a natural pitch $L_0$ comprising:
    providing a substrate;
    forming a first cross-linked polymer mat layer on the substrate;
    depositing a first layer of resist on the first mat layer;
    depositing an etch stop layer resistant to oxygen reactive-ion-etching on the resist layer;
    forming a second cross-linked polymer mat layer on the etch stop layer;
    depositing a second layer of resist on the second mat layer;
    patterning the second layer of resist on the second mat layer into a plurality of spaced second resist stripes having a width substantially equal to $nL_0$ and a pitch substantially equal to $(n+k)L_0$, where n and k are integers equal to or greater than 1;
    reactive-ion-etching the exposed second mat layer in an oxygen gas to remove the second resist and oxidize the exposed second mat layer, leaving a plurality of alternating second mat stripes and oxidized second mat stripes;
    depositing a BCP comprising first and second BCP components on the second mat stripes and oxidized second mat stripes;
    annealing said deposited BCP to cause the BCP to self-assemble into said first and second components on the second mat stripes and oxidized second mat stripes;
    after the BCP has self-assembled, removing the BCP component on the second mat stripes;
    etching the second mat layer, using the BCP component on the oxidized second mat stripes as an etch mask to expose the underlying etch stop layer;
    reactive-ion-etching the exposed etch stop layer, leaving stripes of etch stop layer on the resist layer;

reactive-ion-etching the exposed resist layer and underlying first mat layer in an oxygen gas, using the stripes of etch stop layer as an etch mask, leaving stripes of first mat layer as guiding stripes with oxidized sidewalls, the guiding stripes having a width substantially equal to $nL_0$ and a pitch substantially equal to $(n+k)L_0$, where n and k are integers equal to or greater than 1; and removing the remaining resist layer and etch stop layer.

2. The method of claim 1 wherein the substrate is formed of a material selected from single-crystal Si, amorphous Si, silica, fused quartz, silicon nitride, carbon, tantalum, molybdenum, chromium, alumina and sapphire.

3. The method of claim 1 wherein the substrate comprises a base selected from single-crystal Si, amorphous Si and fused quartz, and a hard mask layer formed on said base.

4. The method of claim 3 wherein the hard mask layer is diamond-like carbon (DLC).

5. The method of claim 1 wherein the second resist is an electron-beam (e-beam) resist and wherein patterning the second resist comprises patterning the e-beam resist with an e-beam.

6. The method of claim 1 wherein each of the first and second polymer mat layers is cross-linked polystyrene.

7. The method of claim 1 wherein the BCP is poly(styrene-block-methyl methacrylate) (PS-b-PMMA).

8. The method of claim 1 wherein the etch stop layer is a silicon-containing etch stop layer.

9. The method of claim 1 wherein n=1 and k=1.

10. The method of claim 1 wherein patterning the second resist on the second mat layer into a plurality of spaced second resist stripes comprises patterning the second resist stripes into a pattern selected from parallel stripes, concentric rings and generally radial lines.

11. The method of claim 10 wherein the spaced second resist stripes are patterned as spaced radial lines, wherein at the radially inner point the spacing of the radial lines may be as small as $0.9L_0$ and at the radially outer point as large as $1.1L_0$.

12. A method for making guiding lines on a substrate for directed self-assembly (DSA) of a block copolymer (BCP) having a natural pitch $L_0$, the substrate comprising a substrate base and a hard mask layer comprising diamond-like carbon (DLC) on the substrate base, the method comprising:

forming a first cross-linked polymer mat layer on the hard mask layer;

depositing a layer of resist on the first mat layer;

depositing a silicon-containing etch stop layer resistant to oxygen reactive-ion-etching on the resist layer;

forming a second cross-linked polymer mat layer on the etch stop layer;

depositing a layer of electron-beam (e-beam) resist on the second mat layer;

patterning with e-beam the e-beam resist on the second mat layer into a plurality of spaced e-beam resist stripes having a width substantially equal to $nL_0$ and a pitch substantially equal to $(n+k)L_0$, where n and k are integers equal to or greater than 1;

reactive-ion-etching the exposed second mat layer in an oxygen gas to remove the e-beam resist and oxidize the exposed second mat layer, leaving a plurality of alternating second mat stripes and oxidized second mat stripes;

depositing a BCP comprising first and second BCP components on the second mat stripes and oxidized second mat stripes;

annealing said deposited BCP to cause the BCP to self-assemble into said first and second components on the second mat stripes and oxidized second mat stripes;

after the BCP has self-assembled, removing the BCP component on the second mat stripes;

etching the second mat layer, using the BCP component on the oxidized second mat stripes as an etch mask to expose the underlying silicon-containing etch stop layer;

reactive-ion-etching the exposed silicon-containing etch stop layer, leaving stripes of silicon-containing etch stop layer on the resist layer;

reactive-ion-etching the exposed resist layer and underlying first mat layer in an oxygen gas, using the stripes of silicon-containing etch stop layer as an etch mask, leaving stripes of first mat layer mat as guiding stripes with oxidized sidewalls on the hard mask layer, the guiding stripes having a width substantially equal to $nL_0$ and a pitch substantially equal to $(n+k)L_0$, where n and k are integers equal to or greater than 1; and removing the remaining resist layer and silicon-containing etch stop layer.

13. The method of claim 12 wherein the BCP has a natural pitch $L_0$ less than 20 nm.

14. The method of claim 12 wherein the substrate base is selected from single-crystal Si, amorphous Si and fused quartz.

15. The method of claim 12 wherein each of the first and second polymer mat layers is cross-linked polystyrene.

16. The method of claim 12 wherein the BCP is poly(styrene-block-methyl methacrylate) (PS-b-PMMA).

17. The method of claim 12 wherein the silicon-containing etch stop layer is formed of poly(trimethylsilylstyrene)).

18. The method of claim 12 wherein n=1 and k=1.

19. The method of claim 12 wherein patterning the e-beam resist on the second mat layer into a plurality of spaced e-beam resist stripes comprises patterning the e-beam stripes into a pattern selected from parallel stripes, concentric rings and generally radial lines.

20. The method of claim 19 wherein the spaced e-beam stripes are patterned as spaced radial lines, wherein at the radially inner point the spacing of the radial lines may be as small as $0.9L_0$ and at the radially outer point as large as $1.1L_0$.

* * * * *